(12) United States Patent
Ashida

(10) Patent No.: US 12,731,772 B2
(45) Date of Patent: Sep. 8, 2026

(54) PLASMA MEASURING METHOD AND PLASMA PROCESSING APPARATUS

(71) Applicant: TOKYO ELECTRON LIMITED, Tokyo (JP)

(72) Inventor: Mitsutoshi Ashida, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 106 days.

(21) Appl. No.: 18/443,196

(22) Filed: Feb. 15, 2024

(65) Prior Publication Data

US 2024/0290589 A1 Aug. 29, 2024

(30) Foreign Application Priority Data

Feb. 27, 2023 (JP) ................................ 2023-028222

(51) Int. Cl.
*H01J 37/32* (2006.01)

(52) U.S. Cl.
CPC ... *H01J 37/32954* (2013.01); *H01J 37/32513* (2013.01); *H01J 2237/24495* (2013.01); *H01J 2237/24564* (2013.01); *H01J 2237/2485* (2013.01)

(58) Field of Classification Search
CPC ........... H01J 37/32954; H01J 37/32513; H01J 2237/24495; H01J 2237/24564; H01J 2237/2485; H01J 37/32935
See application file for complete search history.

(56) References Cited

U.S. PATENT DOCUMENTS 6,097,157 A * 8/2000 Overzet .................... H05H 1/46 315/111.21
2005/0009347 A1* 1/2005 Matsumoto ....... H01J 37/32174 257/E21.252
2019/0074166 A1* 3/2019 Ikeda ................ H01J 37/32935

FOREIGN PATENT DOCUMENTS

JP 2019-046787 A 3/2019

* cited by examiner

*Primary Examiner* — Patrick S Ott
(74) *Attorney, Agent, or Firm* — Fenwick & West LLP

(57) ABSTRACT

Provided is a plasma measuring method for measuring a plasma state using a probe device disposed at a plasma processing apparatus and a measuring circuit including a signal transmitter that outputs an AC voltage, the method comprising: measuring a first current in the measuring circuit when the AC voltage is outputted from the signal transmitter to the probe device in a state where plasma is not generated in the plasma processing apparatus and a second current in a state where plasma is generated in the plasma processing apparatus; measuring a phase difference between a current flowing through the plasma and the AC voltage by vector calculation using the measured first and second currents; and adjusting the AC voltage such that a voltage applied to the plasma becomes constant based on the phase difference and measuring a plasma state based on the measured current flowing through the plasma.

9 Claims, 8 Drawing Sheets

FIG. 3

3
STORAGE PART 31
COMMUNICATION PART 32
CONTROL PART 33
ANALYSIS PART 34
CALCULATION PART 35
80
82
81
72
85
70
1

PLASMA MEASURING METHOD AND PLASMA PROCESSING APPARATUS

CROSS-REFERENCE TO RELATED APPLICATIONS

This application claims priority to Japanese Patent Application No. 2023-028222 filed on Feb. 27, 2023, the entire contents of which are incorporated herein by reference.

TECHNICAL FIELD

The present disclosure relates to a plasma measuring method and a plasma processing apparatus.

BACKGROUND

For example, Japanese Laid-open Patent Publication No. 2019-46787 discloses a probe device including an antenna part installed at an opening formed in a wall of a processing chamber, an electrode connected to the antenna part, and a dielectric support part made of a dielectric material and configured to support the antenna part from the periphery thereof.

SUMMARY

The present disclosure provides a technique capable of measuring a plasma state more accurately.

In accordance with an aspect of the present disclosure, there is provided a plasma measuring method for measuring a plasma state using a probe device disposed at a plasma processing apparatus and a measuring circuit including a signal transmitter that outputs an AC voltage, the method comprising: measuring a first current in the measuring circuit when the AC voltage is outputted from the signal transmitter to the probe device in a state where plasma is not generated in the plasma processing apparatus; measuring a second current in the measuring circuit when the AC current voltage is outputted from the signal transmitter to the probe device in a state where plasma is generated in the plasma processing apparatus; measuring a phase difference between a current flowing through the plasma and the AC voltage by vector calculation using the measured first current and the measured second current; and adjusting the AC voltage such that a voltage applied to the plasma becomes constant based on the phase difference and measuring a plasma state based on the measured current flowing through the plasma.

BRIEF DESCRIPTION OF THE DRAWINGS

FIG. 3 shows an example of a functional configuration of a measuring system and a controller according to an embodiment.

DETAILED DESCRIPTION

Figure 1:
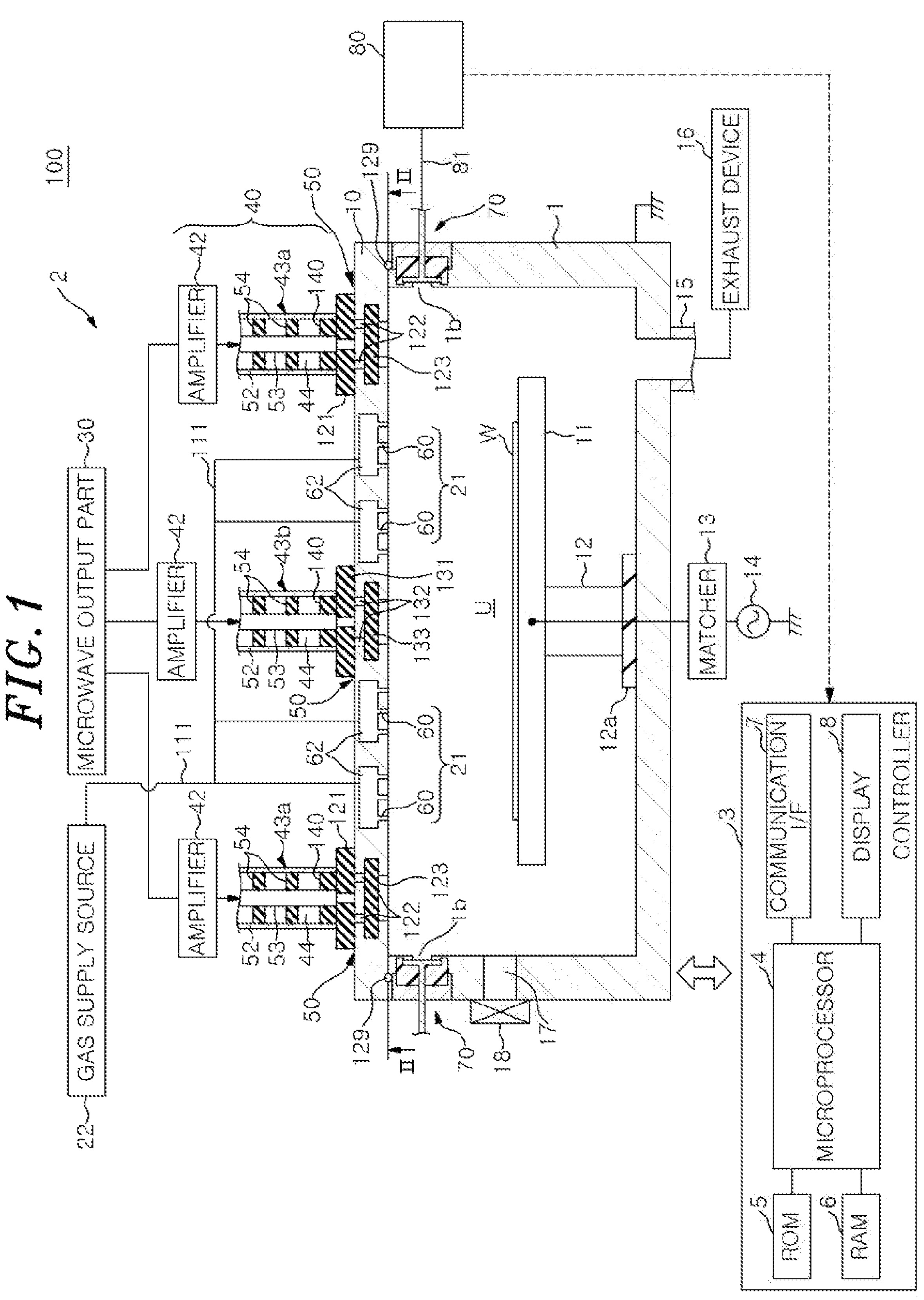
FIG. 1 is a schematic cross-sectional view showing an example of a plasma processing apparatus according to an embodiment.

Hereinafter, embodiments of the present disclosure will be described with reference to the accompanying drawings. Like reference numerals will be given to like or corresponding parts throughout the drawings, and redundant description thereof may be omitted.

<Plasma Processing Apparatus>

FIG. 1 shows an example of a cross-sectional view of a plasma processing apparatus 100 according to an embodiment of the present disclosure. The plasma processing apparatus 100 includes a processing chamber 1 accommodating a substrate W as an example of a semiconductor wafer. The plasma processing apparatus 100 is an example of a plasma processing apparatus for performing plasma processing on a substrate W using surface wave plasma generated on the bottom surface of a ceiling wall 10 of the processing chamber 1 by microwaves. The plasma processing may be film formation, etching, and ashing using plasma.

The plasma processing apparatus 100 includes the processing chamber 1, a microwave plasma source 2, and a controller 3. The processing chamber 1 is a substantially cylindrical container made of a metal such as aluminum or stainless steel. The processing chamber 1 is maintained in an airtight state, and is grounded.

The processing chamber 1 has the ceiling wall 10 and forms a space (plasma generation space U) where a substrate W is processed by plasma. The ceiling wall 10 has a disc shape, and serves as a lid that closes an upper opening of the processing chamber 1. A support ring 129 is disposed on the contact surface between the processing chamber 1 and the ceiling wall 10, so that the inside of the processing chamber 1 is airtightly sealed. The ceiling wall 10 is made of a metal such as aluminum or stainless steel.

The microwave plasma source 2 includes a microwave output part 30, a microwave transmission part 40, and a microwave radiation mechanism 50. The microwave output part 30 distributes microwaves to multiple paths and outputs them. The microwaves are introduced into the processing chamber 1 through the microwave transmission part 40 and the microwave radiation mechanism 50. A gas supplied into the processing chamber 1 is excited by the electric field of the introduced microwaves, so that surface wave plasma is generated.

A placing table 11 on which a substrate W is placed is disposed in the processing chamber 1. The placing table 11 is supported by a cylindrical support member 12 standing upright at the center of the bottom portion of the processing chamber 1 via an insulating member 12*a*. The placing table 11 and the support member 12 may be made of a metal such as aluminum whose surface is alumite-treated (anodically oxidized), or an insulating member (ceramic or the like) having a high-frequency electrode therein. The placing table 11 may be provided with an electrostatic chuck for electrostatically attracting the substrate W, a temperature control mechanism, a gas channel for supplying a heat transfer gas to the backside of the substrate W, or the like.

A radio frequency (RF) bias power supply 14 is connected to the placing table 11 via a matching box 13. By supplying an RF power from the RF bias power supply 14 to the placing table 11, ions in the plasma are attracted toward the substrate W. The RF bias power supply 14 may not be provided depending on characteristics of the plasma processing.

An exhaust line 15 is connected to the bottom portion of the processing chamber 1, and an exhaust device 16 including a vacuum pump is connected to the exhaust line 15. When the exhaust device 16 operates, the processing chamber 1 is exhausted and, thus, a pressure in the processing chamber 1 is quickly reduced to a predetermined vacuum level. The sidewall of the processing chamber 1 is provided with a loading/unloading port 17 for loading/unloading the substrate W, and a gate valve 18 for opening/closing the loading/unloading port 17.

Figure 2:
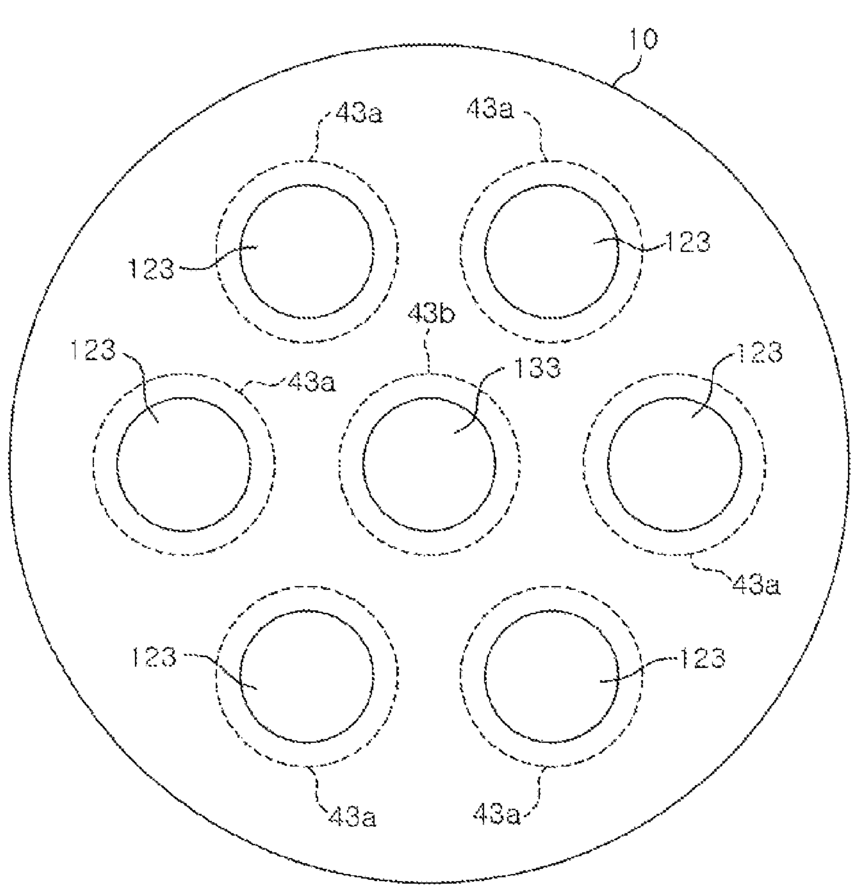
FIG. 2 shows an example of a cross section taken along a line II-II of FIG. 1.

The microwave transmission part 40 transmits the microwaves outputted from the microwave output part 30. FIG. 2 shows a cross part taken along a line II-II of FIG. 1, and shows an example of the bottom surface of the ceiling wall of the plasma processing apparatus 100. Referring to FIG. 2, a central microwave introducing part 43*b* in the microwave transmission part 40 is disposed at the center of the ceiling wall 10, and six peripheral microwave introducing parts 43*a* are arranged at uniform intervals at the peripheral portion of the ceiling wall 10 in a circumferential direction. The central microwave introducing part 43*b* and the six peripheral microwave introducing parts 43*a* have a function of matching an impedance and a function of introducing microwaves outputted from corresponding amplifiers 42 shown in FIG. 1. Hereinafter, the peripheral microwave introducing parts 43*a* and the central microwave introducing part 43*b* may be collectively referred to as "microwave introducing part 43."

As shown in FIGS. 1 and 2, six peripheral dielectric windows 123 are arranged in the ceiling wall 10 under the six peripheral microwave introducing parts 43*a*. Further, one central dielectric window 133 is disposed in the ceiling wall 10 under the central microwave introducing part 43*b*. The number of the peripheral microwave introducing parts 43*a* and the number of the dielectric windows 123 are not limited to six, and may be two or more. However, the number of the peripheral microwave introducing parts 43*a* is preferably three or more, and may be, e.g., three to six.

The microwave radiation mechanism 50 shown in FIG. 1 includes wave retardation plates 121 and 131, slots 122 and 132, and dielectric windows 123 and 133. The wave retardation plates 121 and 131 are made of a disc-shaped dielectric material that transmits microwaves, and are arranged on the upper surface of the ceiling wall 10. The wave retardation plates 121 and 131 are made of, for example, quartz, ceramic such as alumina ($Al_2O_3$), fluorine-based resin such as polytetrafluoroethylene, or polyimide-based resin, which has a dielectric constant greater than that of vacuum. Accordingly, the wave retardation plates 121 and 131 have a function of reducing a size of the antenna including the slots 122 and 132 by making the wavelength of the microwaves transmitted through the wave retardation members 121 and 131 shorter than the wavelength of the microwaves propagating in vacuum.

Under the wave retardation plates 121 and 131, the dielectric windows 123 and 133 are in contact with the back surface of the opening in the ceiling wall 10 via the slots 122 and 132 formed in the ceiling wall 10. The dielectric windows 123 and 133 are made of, for example, quartz, ceramic such as alumina ($Al_2O_3$), a fluororesin-based resin such as polytetrafluoroethylene, or a polyimide-based resin. The dielectric windows 123 and 133 are disposed at positions recessed from the ceiling surface by the thickness of the opening formed in the ceiling wall 10, and are configured to supply microwaves to the plasma generation space U.

In the peripheral microwave introducing parts 43*a* and the central microwave introducing part 43*b*, a cylindrical outer conductor 52 and a rod-shaped inner conductor 53 disposed at the center thereof are arranged coaxially. A microwave power is supplied to the gap between the outer conductor 52 and the inner conductor 53, and the gap therebetween serves as a microwave transmission path 44 through which microwaves propagate toward the microwave radiation mechanism 50.

Each of the peripheral microwave introducing parts 43*a* and the central microwave introducing part 43*b* is provided with a slug 54 and an impedance adjusting member 140 disposed at the tip end thereof. The impedance adjusting member 140 has a function of matching an impedance of a load (plasma) in the processing chamber 1 with a characteristic impedance of a microwave power source in the microwave output part 30 by moving the slug 54. The impedance adjusting member 140 is made of a dielectric material, and is configured to adjust the impedance of the microwave transmission path 44 based on its relative dielectric constant.

The ceiling wall 10 is provided with a gas introducing part 21 having a shower structure. A gas supplied from a gas supply source 22 reaches the gas diffusion space 62 through a gas supply line 111, and is supplied into the processing chamber 1 in a shower pattern through the gas introducing part 21. The gas introducing part 21 is an example of a gas shower head for supplying a gas from a plurality of gas supply holes 60 formed in the ceiling wall 10. The gas may be a gas for plasma generation, such as Ar gas, a gas to be decomposed with high energy, such as $O_2$ gas or $N_2$ gas, a processing gas such as silane gas, or the like.

Individual components of the plasma processing apparatus 100 are controlled by the controller 3. The controller 3 includes a microprocessor 4, a read only memory (ROM) 5, and a random access memory (RAM) 6. A process sequence of the plasma processing apparatus 100 and a process recipe that is a control parameter are stored in the ROM 5 or the RAM 6. The microprocessor 4 controls the individual components of the plasma processing apparatus 100 based on the process sequence and the process recipe. The controller 3 has a communication interface (I/F) 7, and can communicate with other devices. Further, the controller 3 has a display 8, and can display results at the time of performing predetermined control based on the process sequence and the process recipe.

In the case of performing plasma processing in the plasma processing apparatus 100 configured as described above, first, the substrate W is held on a transfer arm (not shown) and loaded into the processing chamber 1 from the open gate valve 18 through the loading/unloading port 17. When the substrate W is transferred to a position above the placing table 11, the substrate W is transferred from the transfer arm to a pusher pin and is placed on the placing table 11 by lowering the pusher pin. The gate valve 18 is closed after the substrate W is loaded. The pressure in the processing chamber 1 is maintained at a predetermined vacuum level by the exhaust device 16. The processing gas is introduced into the processing chamber 1 from the gas introducing part 21 in a shower pattern. The microwaves emitted from the microwave radiation mechanism 50 via the microwave introducing part 43 propagate near the bottom surface that is the inner surface of the ceiling wall. The gas is excited by the electric field of the surface-wave microwave, and the substrate W is subjected to plasma processing by the surface wave plasma generated in the plasma generation space U under the ceiling wall in the processing chamber 1.

<Probe Device>

Figure 3:
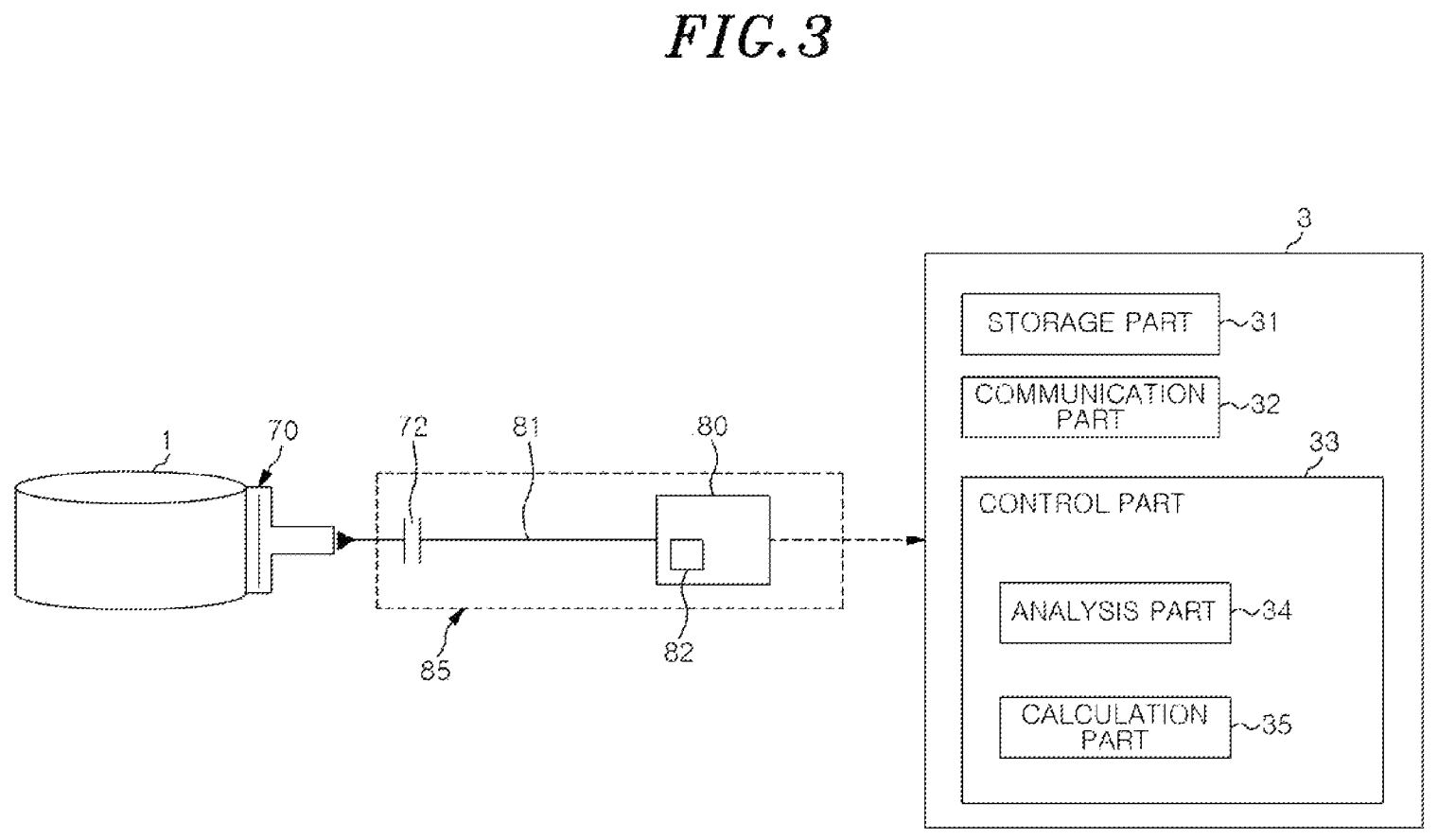

The description of the probe device 70 will be continued with reference to FIGS. 1 and 3. FIG. 3 shows an example of a functional configuration of a measuring system and a controller according to an embodiment. As shown in FIG. 1, one or more openings 1*b* are formed in the sidewall of the processing chamber 1 in the circumferential direction, and one or more probe devices 70 are installed via a sealing member (not shown) for sealing the gap between a vacuum space and an atmospheric space.

A gap with a predetermined width is formed between the tip end surface of the probe device 70 and the back surface near the opening 1*b* formed in the wall of the processing chamber 1. The gap is designed to be wide enough to prevent the probe device 70 from being connected to the wall of the processing chamber 1 in a DC manner, and narrow enough to prevent inflow of plasma or a gas. However, the probe device 70 may be installed at the opening formed in the placing table via a sealing member.

As shown in FIG. 3, the measuring system for measuring a plasma state includes a probe device 70 and a measuring circuit 85. The measuring circuit 85 includes a monitor device 80, a capacitor 72, and a coaxial cable 81. The monitor device 80 is connected to the controller 3 to be communicable therewith.

The probe device 70 is connected to the monitor device 80 via the coaxial cable 81 outside the plasma processing apparatus 100. The monitor device 80 has a signal transmitter 82, and the signal transmitter 82 outputs an AC voltage signal of a predetermined frequency to the coaxial cable 81. The AC voltage signal is transmitted through the coaxial cable 81, and the AC voltage is applied to the probe device 70. The capacitor 72 is connected to the coaxial cable 81, transmits an AC voltage signal to the probe device 70, and blocks a DC voltage signal. Accordingly, the monitor device 80 receives only the AC voltage signal from the plasma side.

The probe device 70 senses plasma generated in the plasma generation space U. The probe device 70 detects a current signal flowing to the plasma side from a signal transmitted to the plasma side, and transmits it to the monitor device 80. The current signal flowing to the plasma side is transmitted from the monitor device 80 to the controller 3, and is received by the communication part 32 of the controller 3. The current value of the received signal is stored in a storage part 31. An analysis part 34 of a control part 33 performs fast Fourier transform (FFT) analysis on the current value of the received signal. A calculation part 35 of the control part 33 calculates a plasma electron temperature $T_e$ or a plasma electron density $N_e$, which will be described later, based on the analysis result. Hence, the plasma state can be estimated accurately.

The storage part 31 is realized by the ROM 5 or the RAM 6 shown in FIG. 1. The communication part 32 is realized by a communication interface 7. The analysis part 34 and the calculation part 35 of the control part 33 are realized by the microprocessor 4.

<Measurement in Probe Device>

Figures 4A, 4B:
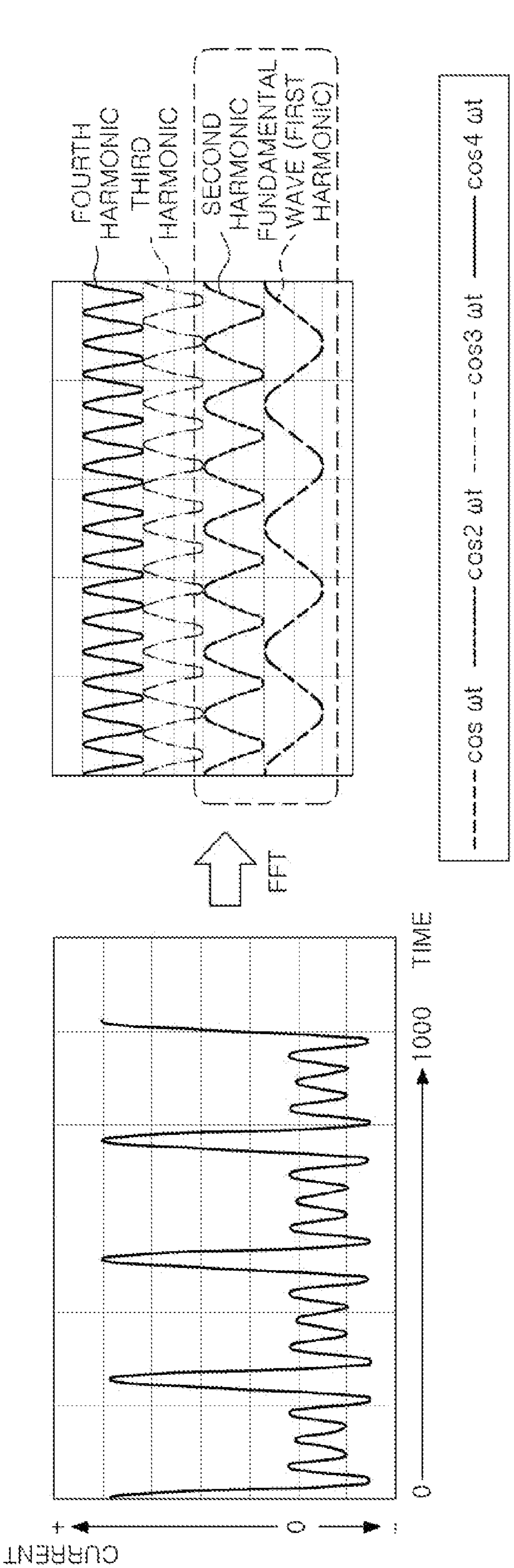
FIGS. 4A and 4B show an example of a measured current signal and a frequency analysis result of the signal.

FIGS. 4A and 4B show an example of the current signal measured by the probe device 70 of the present embodiment and received by the monitor device 80, and the frequency analysis (FFT) result of the current signal described above. FIG. 4A shows a waveform of a current value I that is an example of a current signal. The measured current signal (the current value I) is transmitted from the monitor device 80 to the controller 3, and is received by the communication part 32 of the controller 3. The current signal is subjected to fast Fourier transform (FFT) by the analysis part 34 of the controller 3. Accordingly, as shown in FIG. 4B, the current signal is converted into amplitude components and phase components for each frequency. In plasma, the current flows exponentially with respect to a predetermined voltage. The measured current value I includes a fundamental wave (first harmonic wave) component having a fundamental frequency, and harmonic components whose frequencies are is twice, three times, and four times that of the fundamental wave.

The amplitude component of the fundamental wave in FIG. 4B indicates the first current of the first harmonic wave of the frequency of the AC voltage. A harmonic component whose frequency is twice that of the fundamental wave indicates the first current that is twice the frequency of the AC voltage. In calculating the plasma electron density $N_e$ and plasma electron temperature $T_e$ which will be described below, the first current of the first harmonic wave and the first current of the second harmonic wave are used, and the first currents of the third harmonic wave, the fourth harmonic wave, and higher harmonic waves are not used.

<Plasma Measurement>

Figure 5A:
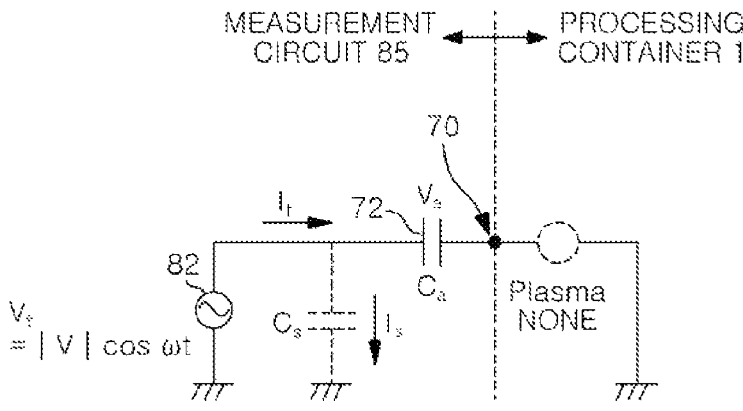
FIGS. 5A to 5C show an example of an equivalent circuit of a measuring system according to an embodiment.
Figure 5B:
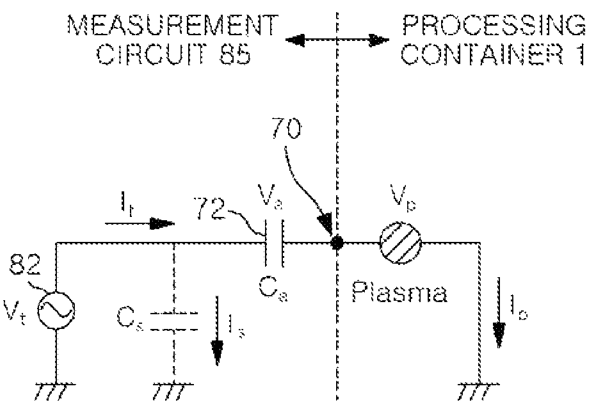
Figure 5C:
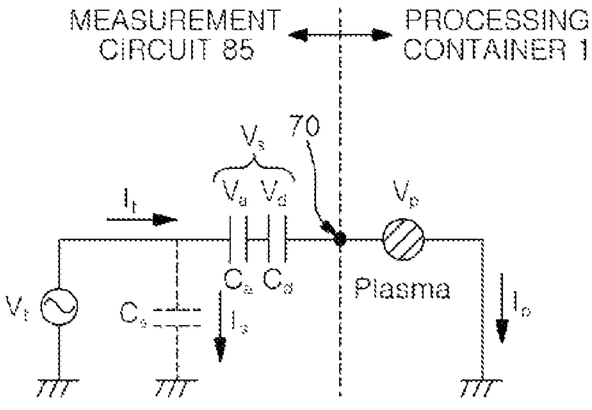

FIGS. 5A to 5C show an example of an equivalent circuit of the measuring system (the measuring circuit 85) according to an embodiment. The right side of the dotted line passing through the probe device 70 in FIGS. 5A to 5C indicates the inside of the processing chamber 1, and the left side of the dotted line indicates the equivalent circuit of the measuring circuit 85. In the plasma measuring method (preparation stage) of the present embodiment, in a state where plasma is not generated in the processing chamber 1 as shown in FIG. 5A, an AC voltage (hereinafter, referred to as "AC voltage $V_t$") is applied from the signal transmitter 82 to the probe device 70. In this case, the probe device 70 measures the current It flowing through the measuring circuit 85. Due to the structure of the measuring system, a stray current (hereinafter, referred to as "stray current $I_s$") flows through a stray capacitance $C_s$ of the measuring circuit 85. As shown in FIG. 5A, in a state where plasma is not generated, the current $I_t$ measured by the measuring circuit 85 is equal to the stray current $I_s$ flowing through the stray capacitance $C_s$. Further, the current $I_t$ is obtained by measuring a voltage drop using a resistance component (not shown) using a voltmeter (not shown) disposed in the measuring circuit 85.

When the AC voltage $V_t$ is applied to the probe device 70 in a state where plasma is not generated, the current $I_t$ is measured by the measuring circuit 85. The current $I_t$ measured in this case is an example of the first current including the magnitude (amplitude) and phase of the current. As shown in FIG. 5A, in a state where plasma is not generated, the current $I_t$ is equal to the stray current $I_s$. The current $I_t$ measured by the measuring circuit 85 is expressed by Eq. (1).

[Eq. 1]

$$I_t = \frac{1}{4}en_s\bar{u}_eA\exp\left(\frac{V_{Bias}-\Phi_p}{T_e}\right) - en_su_BA = \frac{1}{4}en_s\bar{u}_eA\exp\left[\frac{(V_{dc}+V_0\cos\omega t)-\Phi_p}{T_e}\right] - en_su_BA \quad (1)$$

Here, e indicates an elementary charge, $n_s$ indicates an electron density of a plasma sheath surface, $\bar{u}_e$ indicates an average velocity of electrons, A indicates a contact area (i.e., the area of the opening 1*b*) between the probe device 70 and the plasma, $V_{Bias}$ indicates a voltage applied to a probe, $\phi_p$ indicates a plasma potential, $T_e$ indicates an electron temperature of plasma, and us indicates the Bohm velocity. Further, $V_{dc}$ is equal to a self-bias voltage, and $V_0$ is equal to a voltage $V_p$ applied to the plasma. $V_0$ is a value obtained by subtracting a voltage $V_a$ from an AC voltage Vt applied to the probe device 70 in consideration of the voltage Va in a capacitance component Ca of the capacitor 72.

Eq. (1) is transformed using the modified Bessel function of first kind $I_k$, and the measured current $I_t$ is separated into a DC component and an AC component as shown in Eq. (2).

[Eq. 2]

$$I_t = \frac{1}{4} e n_s \overline{u}_e A \exp\left(\frac{V_{dc} - \Phi_p}{T_e}\right) I_0\left(\frac{V_0}{T_e}\right) - e n_s u_B A + \frac{1}{2} e n_s \overline{u}_e A \exp\left(\frac{V_{dc} - \Phi_p}{T_e}\right) \sum_{k=1}^{\infty} I_k\left(\frac{V_0}{T_e}\right) \cos(k\omega t) \tag{2}$$

The upper term on the right side of Eq. (2) is the DC component of the measured current It, and the lower term on the right side of Eq. (2) is the AC component of the current It obtained by multiplying cos(kωt) by a variable. The DC component of the measured current It indicates the DC current flowing between the probe device 70 and the plasma. In the present embodiment, as shown in FIG. 3, the probe device 70 and the coaxial cable 81 are not connected in a DC manner by the capacitor 72, so that the DC component of the current It in Eq. (2) is zero. As a result, Eq. (3) is derived.

[Eq. 3]

$$I_t = \frac{1}{4} e n_s \overline{u}_e A \exp\left(\frac{V_{dc} - \Phi_p}{T_e}\right) \sum_{k=1}^{\infty} I_k\left(\frac{V_0}{T_e}\right) \cos(k\omega t) \tag{3}$$

Eq. (4) is obtained by developing Eq. (3) by Fourier series.

[Eq. 4]

$$|i_{1\omega}|/|i_{2\omega}| = I_1\left(\frac{V_0}{T_e}\right) / I_2\left(\frac{V_0}{T_e}\right) \tag{4}$$

The left side of Eq. (4) is an actual measurement value, and indicates the ratio of the absolute value of the amplitude of the current $i_{1\omega}$ of the first harmonic wave (1ω) to the amplitude of the current $i_{2\omega}$ of the second harmonic wave (2ω). The magnitude of the current $i_{1\omega}$ of the first harmonic wave (1ω) and the magnitude of the current $i_{2\omega}$ of the second harmonic wave (2ω) are obtained by performing the FFT analysis on the current $I_t$ by the analysis part 34 of the control part 33 (see FIG. 4). $|i_{1\omega}|$ is the absolute value of the current value $i_{1\omega}$ of the first harmonic wave of the measured current $I_t$, and $|i_{2\omega}|$ is the absolute value of the current value $i_{2\omega}$ of the second harmonic wave of the measured current It. The right side of Eq. (4) indicates the ratio of the first harmonic wave to the second harmonic wave in the case of developing the current $I_t$ by the modified Bessel function of first kind. $I_1$ is a first-order Bessel function, and $I_2$ is a second-order Bessel function.

Further, the AC component of the current $i_{1\omega}$ in the first harmonic wave is shown in Eq. (5).

[Eq. 5]

$$i_{1\omega} = \frac{1}{2} e n_s \overline{u}_e A \exp\left(\frac{V_{dc} - \Phi_p}{T_e}\right) I_1\left(\frac{V_0}{T_e}\right) \cos \omega t \tag{5}$$

The ion density $n_i$ in the plasma can be calculated by substituting the absolute value of the current $i_{1\omega}$ in the first harmonic wave calculated using Eq. (5) into $|i_{1\omega}|$ in Eq. (6) that is an approximate equation of Eq. (4). The ion density $n_i$ is equal to the plasma electron density $N_e$. From the above, the plasma electron density $N_e$ is calculated.

[Eq. 6]

$$n_i = \frac{|i_{1\omega}|}{2(0.61\, e u_B A)} \frac{I_0(V_0/T_e)}{I_1(V_0/T_e)} \tag{6}$$

e indicates an elementary charge. $u_B$ indicates the Bohm velocity. $I_0(V_o/T_e)$ indicates the zero-order Bessel function. $I_1(V_0/T_e)$ indicates the first-order Bessel function. A indicates the contact area (i.e., the area of the opening 1*b*) between the probe device 70 and the plasma. $V_0$ indicates the voltage Vp applied to the plasma.

Therefore, if the relationship between the voltage $V_p$ (plasma voltage $V_p$) applied to the plasma and the current $I_p$ (plasma current $I_p$) flowing through the plasma is accurately determined, the plasma electron density $N_e$ and the plasma electron temperature $T_e$ can be accurately calculated using Eq. (6).

Therefore, in a state where plasma is generated in the processing chamber 1 as shown in FIG. 5B, the AC voltage $V_t$ is applied from the signal transmitter 82 to the probe device 70. Since a DC voltage is not used, the probe device 70 can perform measurement even during plasma processing. In this case, the probe device 70 measures the current $I_t$ flowing through the measuring circuit 85.

As shown in FIG. 5B, due to the structure of the measuring system, the stray current Is flows through the stray capacitance $C_s$ of the measuring circuit 85. Further, in a state where plasma is generated, the plasma current $I_p$ flows. Therefore, the current $I_t$ measured by the measuring circuit 85 is equal to the sum of the stray current $I_s$ flowing through the stray capacitance $C_s$ and the plasma current $I_p$.

When the AC voltage $V_t$ is applied to the probe device 70 in a state where the plasma is generated, the current $I_t$ is measured by the measuring circuit 85. The current $I_t$ measured in this case is an example of a second current including the magnitude and phase of the current, and is equal to the sum of the stray current $I_s$ and the plasma current $I_p$.

Therefore, the current $I_t$ (first current) measured in a state where plasma is not generated as shown in FIG. 5A is subtracted from the current $I_t$ (second current) measured in a state where plasma is generated as shown in FIG. 5B. Accordingly, the plasma current $I_p$ can be calculated.

Figure 6B:
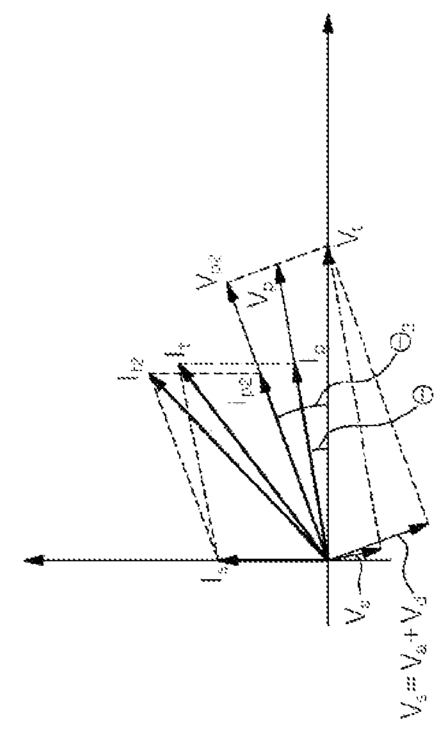
FIGS. 6A and 6B explain a plasma measuring method according to an embodiment.
Figure 6A:
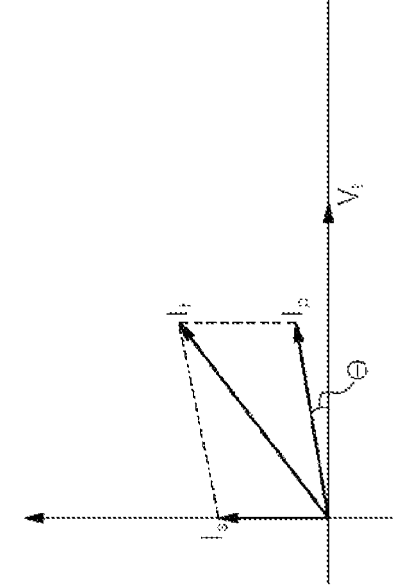

In other words, as shown in FIG. 6A, the stray current $I_s$ is subtracted from the current $I_t$ by vector calculation using the magnitude and phase of the current included in the measured current $I_t$ (second current) and the magnitude and phase of the current included in the stray current $I_s$ (first current). Accordingly, the magnitude of the plasma current $I_p$ and the phase difference θ between the plasma current $I_p$ and the AC voltage $V_t$ are calculated.

If the plasma is considered as a pure resistance, the plasma current $I_p$ and the voltage $V_p$ applied to the plasma have the same phase, so that the phase difference between the AC voltage $V_t$ and the voltage $V_p$ applied to the plasma can be determined from the obtained plasma current $I_p$. From the phase difference θ (=ωt), the value of the voltage $V_p$ actually applied to the plasma can be determined using Eq. (7).

$$Vp = Vt \times \cos\theta \tag{7}$$

From the above, the plasma voltage $V_p$ can be derived based on the AC voltage $V_t$ and the phase difference θ.

<Influence of Deposits>

In the plasma measuring method of the present embodiment, when the plasma is not ignited as shown in FIG. 5A, the AC voltage $V_t$ is outputted and applied to the stray capacitance $C_s$, and the stray current $I_s$ flowing through the stray capacitance $C_s$ is measured before the plasma ignition. Further, when the plasma is ignited as shown in FIG. 5B, the AC voltage $V_t$ is outputted, and the previously measured stray current $I_s$ (first current) is subtracted from the current $I_t$ flowing through the measuring circuit 85 by vector calculation, thereby measuring the plasma current $I_p$.

Films or reaction products generated during substrate processing such as film formation or etching are adhered to and accumulated in the processing chamber 1. Therefore, deposits such as films or reaction products are also adhered to the probe device 70 from the opening 1*b*. The capacitance component in the measuring circuit 85 changes due to the influence of deposits adhered to the surface of the probe device 70.

For example, FIGS. 5A and 5B show a state in which no deposit is adhered to the surface of the probe device 70, and FIG. 5C shows a state in which deposits are adhered to the surface of the probe device 70. The measuring circuit 85 of FIG. 5C shows a state in which a capacitance component Ca is added to the capacitance component $C_a$ of the capacitor 72 due to the influence of deposits adhered to the surface of the probe device 70. Accordingly, the voltage $V_p$ applied to the plasma varies depending on the voltage $V_d$ corresponding to the capacitance component $C_d$. Further, deposits gradually increase as the process progresses, and are removed by cleaning. Therefore, the total voltage ($V_a$+$V_d$) applied to the series capacitance components $C_a$ and $C_d$ in the measuring circuit 85 changes by the progress of the process and the cleaning due to the influence of the deposits. Hereinafter, the total voltage ($V_a$+$V_d$) will also be referred to as "total voltage $V_s$."

Hence, when the AC voltage $V_t$ is maintained at a constant level, the value of the voltage $V_p$ actually applied to the plasma changes in the state shown in FIG. 5B and the state shown in FIG. 5C. When the voltage $V_p$ applied to the plasma changes, the value of the current $I_p$ flowing through the plasma also changes. Hence, it is difficult to perform plasma measurement under the same conditions, and errors may occur in the measurement result of the plasma state such as the measured plasma density or the like. Therefore, in order to accurately measure the plasma state, it is important to maintain the voltage $V_p$ applied to the plasma at a constant level regardless of existence or non-existence of deposits. In a state where plasma is not generated as shown in FIG. 5A, there is no influence of deposits, and the current $I_t$ flowing through the measuring circuit 85 is equal to the stray current $I_s$.

(Plasma Measurement Considering Capacitance Component Cd of Deposits)

Therefore, plasma measurement is performed in consideration of the capacitance component Cd of the deposits. In a state where the plasma is ignited, the AC voltage $V_t$ is applied from the signal transmitter 82 to the probe device 70, and a current value $I_t$ is measured by the measuring circuit 85. The measured current value $I_t$ is the sum of the stray current $I_s$ and the plasma current $I_p$ as shown in FIG. 6A, and the stray current $I_s$ is measured in advance in a state where plasma is not generated and stored in the storage part 31. Accordingly, by subtracting the stray current $I_s$ from the measured current value $I_t$ by vector calculation, the plasma current $I_p$ and the phase difference θ between the plasma current $I_p$ and the AC voltage $V_t$ shown in FIG. 6A can be calculated.

The applied AC voltage $V_t$ is expressed by the vector sum of the voltage $V_p$ applied to the plasma and the total voltage $V_s$ (=$V_a$+$V_d$) applied to the series capacitance components $C_a$ and $C_d$, as shown in FIG. 6B. If plasma is considered as a pure resistance, the plasma current $I_p$ and the voltage $V_p$ applied to the plasma have the same phase. In the example of FIG. 6B, when there is no deposit, the plasma current $I_p$ and the voltage $V_p$ applied to the plasma have the same phase θ. Therefore, the voltage $V_p$ applied to the plasma is equal to $V_t$ cos θ according to Eq. (7), so that the plasma voltage $V_p$ that is an initial value can be derived based on the AC voltage $V_t$ and the phase difference θ.

Accordingly, as shown in FIG. 6B, the AC voltage $V_t$ can be separated into the plasma voltage $V_p$ and the total voltage $V_s$ applied to the series capacitance components $C_a$ and $C_d$ by vector calculation. Hence, when there is no deposit, the capacitance component $C_d$ becomes 0, and the total voltage $V_s$ applied to the series capacitance components $C_a$ and $C_d$ becomes substantially the voltage $V_a$.

However, as the amount of deposits increases, the influence of the capacitance component $C_d$ increases, and the total voltage Vs shown in FIG. 6B increases and the phase angle θ also changes. Therefore, if the applied AC voltage $V_t$ is constant, the voltage $V_p$ applied to the plasma becomes smaller. In the example of FIG. 6B, the phase angle changes from the phase angle θ corresponding to the case where there is no deposit to a phase angle θ2 corresponding to the case where the amount of deposits increases (θ2>θ). Therefore, if the applied AC voltage $V_t$ is constant, the voltage $V_p$ applied to the plasma decreases from the voltage $V_p$ to the voltage $V_{p2}$. Even when the amount of deposits increases, the plasma current $I_{p2}$ and the voltage $V_{p2}$ applied to the plasma have the same phase θ2.

Therefore, Eq. (8) is obtained from Eq. (7).

$$V_t = V_P/\cos\theta \tag{8}$$

The value of the AC voltage $V_t$ is adjusted by substituting the plasma voltage $V_p$ derived as the initial value into $V_p$, for example, into Eq. (8) and by substituting, as the phase angle θ at this time, into Eq. (8) the value of the phase angle θ calculated by the vector calculation with the stray current Is from the current value $I_t$ measured in a state where the plasma is ignited. The current value $I_t$ in FIG. 6B is a current value measured when there is no deposit, and a current value $I_{t2}$ is a current value measured when the amount of deposits is large. Since the change in the stray current $I_s$ with respect to the change in the AC voltage $V_t$ is very small when there is no deposit and when the amount of deposits is large, the stray current $I_s$ can be maintained at a constant level regardless of the amount of deposits. From the above, the value of the AC voltage $V_t$ is adjusted to become large as the amount of deposits in the plasma processing apparatus 100 increases, and the value of the AC voltage $V_t$ is adjusted to become smaller as the amount of deposits decreases. Accordingly, the voltage $V_p$ applied to the plasma can be maintained at a constant level, and the plasma measurement can be performed under the same conditions. As a result, the plasma state can be accurately measured without causing any error in the plasma state measurement result. When there is a large difference between the adjusted AC voltage $V_{t'}$ and the previously used AC voltage $V_t$, if more accurate calculation is required, the phase angle θ may be calculated, as the phase θ at the time of using Eq. (8), by storing $\alpha = I_s/V_t$ instead of pre-storing $I_s$ as the stray current in the storage part and using the value of $I_{s'}$ ($I_{s'} = \alpha * V_{t'}$) that is the stray current at the time of adjusting the AC voltage $V_t$.

The AC voltage $V_t$ is calculated such that the voltage $V_p$ applied to the plasma becomes constant, and the plasma current $I_p$ is calculated while adjusting the AC voltage $V_t$.

Further, the first current of the first harmonic wave of the frequency of the AC voltage $V_t$ is calculated from the measured current $I_t$ that is the actual measurement value by frequency analysis. Then, the absolute value of the first current of the first harmonic wave is substituted into $|i_{1\omega}|$ in Eq. (6). Accordingly, at least one of the plasma electron density $N_e$, the electron temperature $T_e$, or the ion density $N_i$ can be derived more accurately.

The current $I_t$ (first current) may be repeatedly measured periodically or irregularly in a state where plasma is not generated as shown in FIG. 5A. Then, the stray current $I_s$ may be calculated based on the latest measured current $I_t$. The AC voltage $V_t$ for obtaining the current $I_t$ is constantly applied to the probe device 70 during a period in which the plasma is not ignited. Accordingly, the stray current Is serving as the latest reference is constantly updated and stored in the storage part 31. Hence, the current flowing through the plasma can be measured more accurately by subtracting the value of the latest stray current $I_s$ from the current $I_t$ measured in a state where plasma is generated by vector calculation.

<Plasma Measuring Method (Preparation)>

Figure 7:
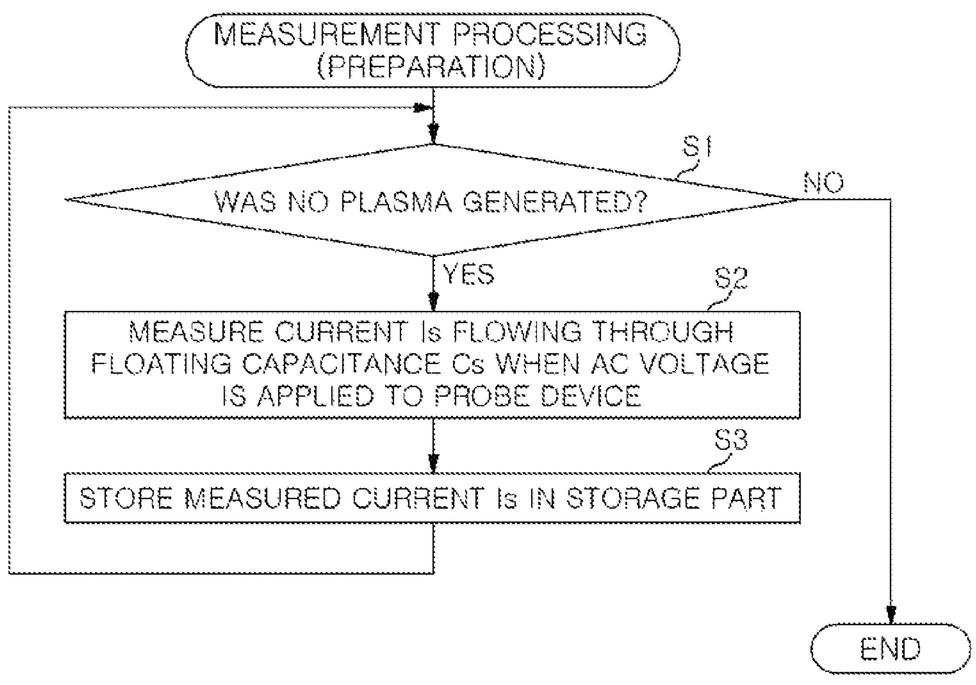
FIG. 7 is a flowchart showing an example of a plasma measuring method (preparation) according to an embodiment.

A plasma measuring method (preparation) performed in a state where plasma is not generated as shown in FIG. 5A will be described with reference to FIG. 7. FIG. 7 is a flowchart showing an example of the plasma measuring method (preparation) according to an embodiment.

In this process, in step S1, the monitor device 80 determines whether or not plasma is generated in the plasma processing apparatus 100. The monitor device 80 may acquire information on whether or not plasma is generated from the recipe information. For example, the monitor device 80 may determine time during the process from the recipe information, and may determine that plasma is not generated in an idle state before the start of the process and after the end of the process. However, the method for determining whether or not plasma is generated is not limited thereto. If the monitor device 80 determines that plasma is generated, this process is ended.

On the other hand, if the monitor device 80 determines in step S1 that plasma is not generated in the plasma processing apparatus 100, the process proceeds to step S2. Then, in step S2, the AC voltage $V_t$ is applied from the signal generator 82 to the probe device 70, and the measuring circuit 85 measures the current $I_t$ (first current) including the magnitude (amplitude) and phase of the current. The measured current $I_t$ includes the magnitude (amplitude) and phase of the current. The measured current $I_t$ is equal to the stray current $I_s$ (see FIG. 5A). Therefore, the stray current $I_s$ can be measured by measuring the current $I_t$. The signal of the measured stray current $I_s$ is transmitted from the monitor device 80 to the controller 3. The controller 3 receives the stray current $I_s$ including the magnitude (amplitude) and phase of the current.

Next, in step S3, the calculation part 35 of the controller 3 stores the stray current $I_s$ including the magnitude (amplitude) and phase of the current in the storage part 31, and this process is ended.

<Measurement Process>

Figure 8:
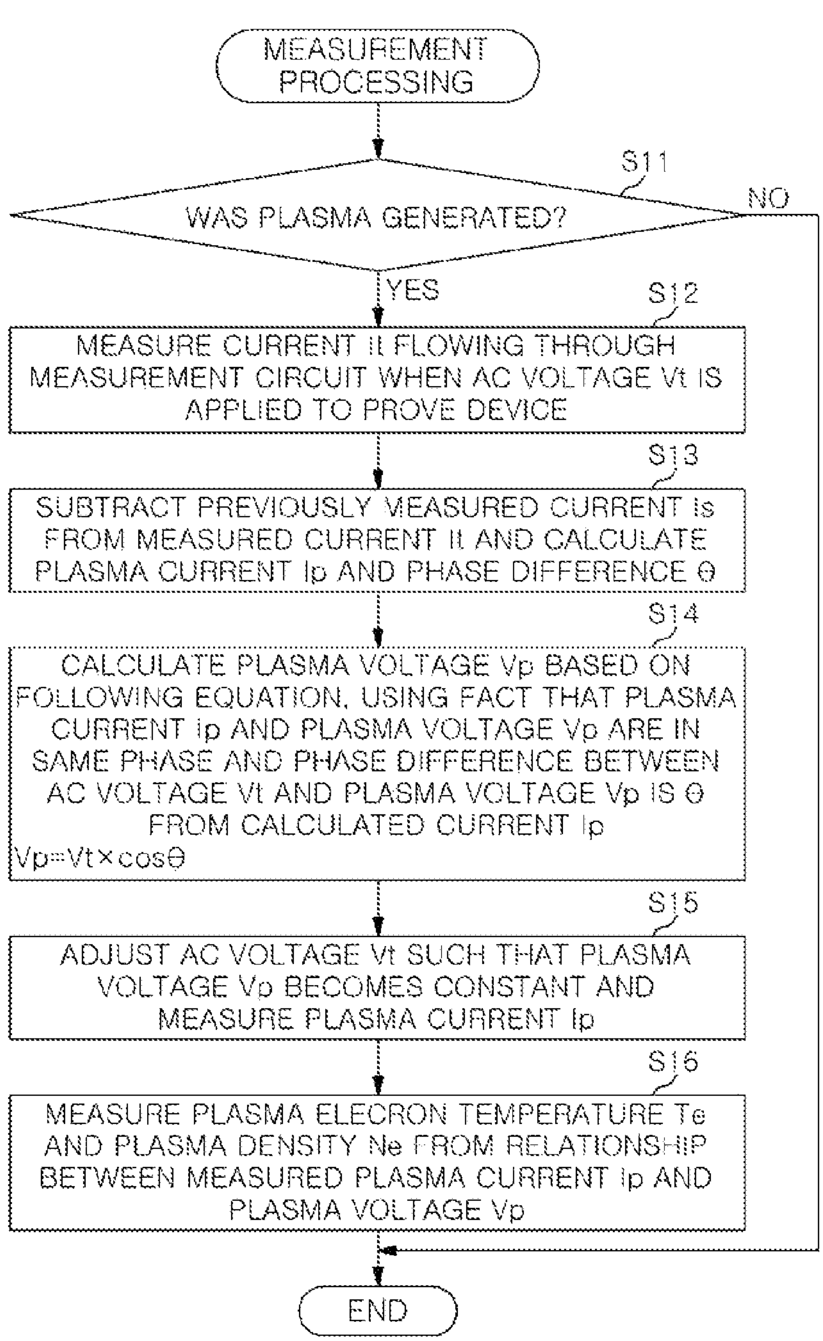
FIG. 8 is a flowchart showing an example of a plasma measuring method according to an embodiment.

A measurement process performed in a state where plasma is generated, which is an example shown in FIGS. 5B and 5C, will be described with reference to FIG. 8. FIG. 8 is a flowchart illustrating an example of a plasma measuring method according to an embodiment. Before the plasma measuring method of FIG. 8 is performed, the plasma measuring method of FIG. 7 is performed at least once, and the magnitude of the stray current $I_s$ is stored in the storage part 31 of the controller 3.

In this process, in step S11, the monitor device 80 determines whether or not plasma is generated in the plasma processing apparatus 100. The determination method may be the method described in step S1 of FIG. 7. If the monitor device 80 determines that plasma is not generated, this process is ended.

On the other hand, if the monitor device 80 determines in step S11 that plasma is generated in the plasma processing apparatus 100, the process proceeds to step S12. Then, in step S12, the AC voltage $V_t$ is applied from the signal generator 82 to the probe device 70, and the measuring circuit 85 measures the current $I_t$ (second current) including the magnitude (amplitude) and phase of the current. Next, in step S13, the vector calculation is performed to subtract the previously measured stray current $I_s$ from the measured current $I_t$ (see FIGS. 5B and 6A). Accordingly, the magnitude of the current $I_p$ flowing through the plasma, and the phase difference θ between the current $I_p$ flowing through the plasma and the AC voltage $V_t$ can be measured.

Next, in step S14, the voltage $V_p$ applied to the plasma is calculated. If plasma is considered as a pure resistance, the plasma current $I_p$ and the voltage $V_p$ applied to the plasma have the same phase. Therefore, the phase difference θ between the plasma current $I_p$ and the AC voltage $V_t$ calculated in step S13 can be used to determine the phase difference between the AC voltage $V_t$ and the voltage $V_p$ applied to the plasma. From the phase difference θ, the values of the voltage $V_t$ and the AC voltage $V_p$ actually applied to the plasma can be accurately determined using Eq. (7).

Next, in step S15, the applied AC voltage $V_t$ is adjusted such that the plasma voltage $V_p$ becomes constant. Specifically, the AC voltage $V_t$ is adjusted depending on deposits such that the plasma voltage $V_p$ does not change due to the change in the voltage $V_d$ applied to the deposits deposited in the plasma processing apparatus 100 (see FIG. 5C). After the AC voltage $V_t$ is adjusted, the first current (the current $I_t$ measured in the state shown in FIG. 5A) and the second current (the current $I_t$ measured in the state shown in FIG. 5C) are newly measured. The current $I_p$ flowing through the plasma is measured by subtracting the newly measured first current from the newly measured second current.

Next, in step S16, the plasma electron temperature $T_e$ and the plasma electron density $N_e$ are calculated using Eq. (6)

from the calculated relationship between the plasma current $I_p$ and the plasma voltage $V_p$, and this process is ended.

As described above, in accordance with the plasma measuring method and plasma processing apparatus of the present embodiment, the plasma state can be maintained more accurately under more constant conditions by adjusting the applied AC voltage $V_t$ such that the plasma voltage $V_p$ becomes constant.

The plasma measuring method and the plasma processing apparatus according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

The plasma processing apparatus of the present disclosure can be applied to any type of apparatus such as an atomic layer deposition (ALD) apparatus, a capacitively coupled plasma (CCP) processing apparatus, an inductively coupled plasma (ICP) processing apparatus, a radial line slot antenna (RLSA), an electron cyclotron resonance plasma (ECR) processing apparatus, and a helicon wave plasma (HWP) processing apparatus.

The plasma processing apparatus disclosed in this specification can be applied to any of a single-wafer type apparatus for processing substrates one by one, and a batch type apparatus or a semi-batch type apparatus for processing a plurality of substrates at once.

The invention claimed is:

1. A plasma measuring method for measuring a plasma state using a probe device disposed at a plasma processing apparatus and a measuring circuit including a signal transmitter that outputs an AC voltage, the method comprising:

(A) measuring a first current in the measuring circuit when the AC voltage is outputted from the signal transmitter to the probe device in a state where plasma is not generated in the plasma processing apparatus;

(B) measuring a second current in the measuring circuit when the AC voltage is outputted from the signal transmitter to the probe device in a state where plasma is generated in the plasma processing apparatus;

(C) measuring a phase difference between a current flowing through the plasma and the AC voltage by vector calculation using the measured first current and the measured second current; and (D) adjusting the AC voltage based on the phase difference such that a voltage applied to the plasma becomes constant, and measuring a plasma state based on the current flowing through the plasma, wherein in said (D), based on that the current flowing through the plasma and the voltage applied to the plasma have a same phase, the AC voltage is adjusted by using the phase difference as a phase difference between the voltage applied to the plasma and the AC voltage.

2. The plasma measuring method of claim 1, wherein in said (C), the current flowing through the plasma is measured by subtracting the first current from the second current.

3. The plasma measuring method of claim 1, wherein after the AC voltage is adjusted in said (D), said (A) and said (B) are executed to newly measure the first current and the second current, and in said (C), the current flowing through the plasma is measured by subtracting the newly measured first current from the newly measured second current.

4. The plasma measuring method of claim 1, further comprising:

(E) deriving at least one of a plasma electron density, a plasma electron temperature, or a plasma ion density indicating the plasma state based on the measured current flowing through the plasma.

5. The plasma measuring method of claim 1, wherein in said (A), the first current is repeatedly measured periodically or irregularly in a state where the plasma is not generated.

6. The plasma measuring method of claim 5, wherein in said (C), the current flowing through the plasma is measured by subtracting the latest measured first current from the measured second current.

7. The plasma measuring method of claim 1, wherein in said (D), the AC voltage is adjusted depending on deposits deposited in the plasma processing apparatus such that the voltage applied to the plasma does not change by a voltage applied to the deposits.

8. The plasma measuring method of claim 1, wherein the probe device is installed at an opening formed in a wall of a processing chamber of the plasma processing apparatus via a sealing member configured to seal a gap between a vacuum space and an atmospheric space.

9. A plasma processing apparatus including a measuring circuit including a signal transmitter that outputs an AC voltage, and a controller including a communication part and a control part, wherein the communication part is configured to:

receive a first current measured by the measuring circuit when the AC voltage is outputted from the signal transmitter to a probe device in a state where plasma is not generated in the plasma processing device; and receive a second current measured by the measuring circuit when the AC voltage is outputted from the signal transmitter to the probe device in a state where plasma is generated in the plasma processing apparatus;

the control part is configured to:

measure a phase difference between a current flowing through the plasma and the AC voltage by vector calculation using the received first current and second current; and adjust the AC voltage based on the phase difference such that a voltage applied to the plasma becomes constant, and measure a plasma state based on the current flowing through the plasma, wherein, based on that the current flowing through the plasma and the voltage applied to the plasma have a same phase, the AC voltage is adjusted by using the phase difference as a phase difference between the voltage applied to the plasma and the AC voltage.

* * * * *